United States Patent
Kuribayashi et al.

(10) Patent No.: US 6,480,751 B1
(45) Date of Patent: Nov. 12, 2002

(54) COMPONENT SUPPLYING METHOD, COMPONENT ARRANGEMENT DATA FORMING METHOD AND ELECTRONIC COMPONENT MOUNTING APPARATUS USING THE METHODS

(75) Inventors: Takeshi Kuribayashi, Yamanashi (JP); Satoshi Nonaka, Yamanashi (JP); Shigeki Imafuku, Nieasaki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/341,644

(22) PCT Filed: Jan. 16, 1998

(86) PCT No.: PCT/JP98/00124

§ 371 (c)(1),
(2), (4) Date: Aug. 15, 1999

(87) PCT Pub. No.: WO98/32318

PCT Pub. Date: Jul. 23, 1998

(30) Foreign Application Priority Data

Jan. 16, 1997 (JP) .............................................. 9-005219

(51) Int. Cl.[7] .............................................. G05B 19/18
(52) U.S. Cl. ......................... 700/56; 29/701; 700/229
(58) Field of Search .............................. 700/9, 56, 100, 700/101, 121, 230, 215; 29/701, 430, 711; 235/375

(56) References Cited

U.S. PATENT DOCUMENTS

| | | | |
|---|---|---|---|
| 4,610,083 A | | 9/1986 | Campisi et al. ................ 29/740 |
| 5,235,164 A | * | 8/1993 | Noyama et al. ............. 235/375 |
| 5,237,508 A | * | 8/1993 | Furukawa et al. ............. 700/9 |
| 5,329,690 A | * | 7/1994 | Tsuji et al. .................... 29/701 |
| 5,564,183 A | * | 10/1996 | Satou et al. ................... 29/593 |
| 5,719,796 A | * | 2/1998 | Chen ............................. 700/9 |

FOREIGN PATENT DOCUMENTS

| | | |
|---|---|---|
| EP | 0 476 577 | 3/1992 |
| JP | 4-155998 | 5/1992 |
| JP | 4-164398 | 6/1992 |

* cited by examiner

*Primary Examiner*—Leo Picard
*Assistant Examiner*—Kidest Bahia
(74) *Attorney, Agent, or Firm*—Wenderoth, Lind & Ponack, L.L.P.

(57) ABSTRACT

High-speed high-reliability component supplying method and mounting method is obtained by checking whether or not a component is the regular component to be mounted through a component type detecting process by means of component arrangement data having a plurality of substitute component type names of components which can be mounted in the proper position of a component supply section and a detection section and a comparing and deciding process.

16 Claims, 12 Drawing Sheets

Fig.3

| COMPONENT ARRANGEMENT POSITION NUMBER | COMPONENT TYPE NAME | | | OTHER INFORMATION |
|---|---|---|---|---|
| | MASTER | SUBSTITUTE (OR) A | SUBSTITUTE (OR) B | |
| Z0 | P0 | Pa | Pb | • RESULT OF CHECKING (HISTORY) • RECOGNITION DATA |
| Z1 | P1m | P1a | P1b | |
| Z2 | P2m | —(NOTHING) | | |
| Z3 | P3m | P3a | — | |
| Z4 | — | — | — | |
| ⋮ | ⋮ | ⋮ | ⋮ | |
| Zn | Pnm | Pna | Pnb | |

Fig.4A

| COMPONENT ARRANGEMENT POSITION NUMBER (200a) | COMPONENT TYPE NAME (MASTER) (201) | COMPONENT TYPE NAME (MASTER) (220) | SUBSTITUTE (OR) A | B | C | --- |
|---|---|---|---|---|---|---|
| Z1 | P1m | → P1m | P1a | P1b | — | --- |
| Z2 | P2m | ↘ P3m | P3a | — | — | --- |
| Z3 | P3m | ↗ P2m | P2x | — | — | --- |
| ⋮ | ⋮ | ⋮ | ⋮ | ⋮ | ⋮ | |
| Zn | Pnm | → Pnm | Pna | Pnb | Pnc | --- |

(203 indicates the mapping between the two COMPONENT TYPE NAME (MASTER) columns; 204 braces the SUBSTITUTE columns)

Fig.4B

| MOUNTING NUMBER (230) | CONTROL COMMAND (200b) | COORDINATE X | COORDINATE Y | COMPONENT ARRANGEMENT POSITION NUMBER (201) | COMPONENT TYPE NAME (MASTER) (200) | SUBSTITUTE (OR) A (202) | SUBSTITUTE (OR) B |
|---|---|---|---|---|---|---|---|
| 0 | ABC | X0 | Y0 | Z0 | P0 | Pa | Pb -- |
| 1 | S1 | X1 | Y1 | Z1 | P1m | P1a | P1b -- |
| 2 | S2 | X2 | Y2 | Z2 | P2m | — | — -- |
| 3 | S3 | X3 | Y3 | Z3 | P3m | P3a | — -- |
| ⋮ | ⋮ | ⋮ | ⋮ | ⋮ | ⋮ | ⋮ | ⋮ |
| K | Sk | Xk | Yk | Zn | Znm | Pna | Pnb -- |
| ⋮ | ⋮ | ⋮ | ⋮ | ⋮ | ⋮ | ⋮ | ⋮ |

*Fig.10*

| COMPONENT ARRANGEMENT POSITION NUMBER | COMPONENT TYPE NAME | | | OTHER INFORMATION |
|---|---|---|---|---|
| | MASTER | SUBSTITUTE (OR) A | SUBSTITUTE (OR) B | |
| Z0 | P0 | Pa | Pb | |
| Z1 | P1m | P1a | P1b | |
| Z2 | P2m | P2a | P2b | |
| Z3 | P3m | P3a | P3b | • RESULT OF CHECKING (HISTORY) |
| Z4 | — | — | — | • RECOGNITION DATA |
| ⋮ | ⋮ | ⋮ | ⋮ | |
| Zn | Pnm | Pna | Pnb | |

OUTPUT RESULT

Z1 P1a
Z2 P2m
Z3 P3a
⋮
Zn Pna

OUTPUT RESULT

Z1 P1b
Z2 P2m
Z3 P3m
⋮
Zn Pnb

COMPONENT SUPPLYING METHOD, COMPONENT ARRANGEMENT DATA FORMING METHOD AND ELECTRONIC COMPONENT MOUNTING APPARATUS USING THE METHODS

TECHNICAL FIELD

The present invention relates to the provision of an efficient component mounting method for deciding the types of a variety of supplied components such as those purchased from two different corporations, which can be used in the objective mounting position for the improvement of mounting quality in an electronic component mounting apparatus for mounting electronic components of set, tray, stick, bulk and other types on a printed board and the apparatus of the method.

BACKGROUND ART

Conventionally, a component supplying method concerning component mounting and an apparatus for performing the method includes those in the documents of Japanese Laid-Open Patent Publication No. 4-155998, and Japanese Laid-Open Patent Publication No. 4-164398. In these publications, there is disclosed a component supplying method concerning component mounting and an apparatus for the method wherein a plurality of parts cassettes for storing components to be mounted on printed boards are removably attached to the component mounting apparatus. Therefore, the parts cassettes can reciprocally move along the longitudinal direction of the apparatus and position one of the parts cassettes which stores required components at a component supply position of the apparatus. After the parts cassette which stores required components is positioned at a component supply position, a component mounting head (suction head) of the apparatus moves to the component supply section and sucks one of the components in the positioned parts cassette, and then moves to a board onto which the sucked component is mounted while passing over a detection section. When the sucked component is passed over the detection section, the configuration of the component is detected by a detector to determine whether or not the sucked component is a required one. If not, the sucked component is not mounted on the board and is discharged to a discharge section. If yes, the sucked component is mounted on the board.

The mounting apparatus is shown in FIG. 2, and an example of its component supply section is shown in FIG. 8. Component supply units (parts cassettes) 10 are mounted in a number of component supply positions (Z1, Z2, ..., Zn, ... ) at a component supply section 5. A detection section 9 determines the type of the component, and the component is supplied to a component mounting section 6 and mounted onto a printed board on a mounting table 2.

In this electronic component mounting apparatus, the component type to be set in the proper supply position of the component supply section is not limited to one type, and sometimes the component is a similar component of another manufacturer or a less expensive component having different characteristics such as different ranks of components having different tolerances. If the component is identical, sometimes the component type name on the manufacturer side differs from the component type name given on the purchaser side for individual control purpose. Therefore, it is difficult to specify the component to be actually set in an arbitrary component supply position by a sole component type name due to the practice of purchasing components from two or three component manufacturers (referred to as a two-route purchase hereinafter) for the purpose of stably obtaining and preparing the components. Accordingly, there exists a plurality of components which can be used and mounted (referred to as substitute components) other than the basic component to be properly used (referred to as a master component hereinafter). For example, each of the master components is a component which is normally used or has best quality. Therefore, when laying in those components, it is required to give them a sole component type name as a master component type name or representative component type name with a certain substitute code, give the components a label of the name or reissue the label and attach the same, and this disadvantageously increases the cost.

Specifically, it is supposed that the conventional apparatus performs component mounting operation by using NC program having data wherein the numbers of the component arrangement positions Z0, Z1, Z2, Z3, Z4, ... Zn correspond to only master components of component type names P0, P1$m$, P2$m$, P3$m$, P4$m$, ... P$nm$ but do not correspond to any substitute component. In such an apparatus, when one of the master components P1$m$ is consumed, the mounting operation of the apparatus is stopped. Then, an operator inputs information that the consumed master component can be replaced with a substitute component P1$s$, and thereafter the apparatus restarts under the NC program including the above replacement information. But this means declining the productivity.

Otherwise, at the production site, a determination accuracy of the component type to be mounted is assured by forming a comparison list or the like of the master component to be set in the proper supply position with the substitute components, comparing each component with the comparison list or taking a similar measure, and verifying the component by two operators so as not to select the wrong component to be mounted or taking a similar measure when setting the component. However, due to a mistake of the operators, a defective product caused by erroneous setting and erroneous mounting of components is often produced. In addition, an error disadvantageously occurs at the time of recognizing and correcting the position of the component held by a component mounting head due to a difference in the outer configuration, a difference in dimensions and thickness of the connection terminal section, and a difference in color between the substitute component and the master component. Accordingly, it is necessary to replace the component recognition data by designating the regular component recognition data set in the component supply section for the purpose of executing the correct operation, and to stop the mounting apparatus once for manually carrying out the determination and designation, and this causes a reduction in the productivity as a stop loss of the equipment.

In order to cope with the actual situation at the production site, an object of the present invention is to provide a component supplying method for implementing a highly reliable component mounting check including a plurality of substitute components at the component supply section even when the substitute component is used for mounting, and its component arrangement data forming method. The object of the present invention is to provide a highly reliable mounting method by automatically selecting the component recognition data necessary for the substitute component and effectively executing the component recognition and correction at the component mounting section.

SUMMARY OF THE INVENTION

In order to solve this problem, the component supplying method, its data forming method and component mounting apparatus of the present invention determines through comparing whether a component is the regular component based on component arrangement data having a plurality of (substitute) component type names of the components which can be mounted in the proper supply position of the component supply section.

In accomplishing these and other aspects, according to a first aspect of the present invention, there is provided a component supplying method for a component supply section which supplies a component to a component mounting section for mounting the component on a printed board. A component type set in the component supply position is detected by using component arrangement data having a plurality of substitute component type names of components which can be mounted in a proper supply position, and using a detection section. It is then determined whether the component set in the component supply position is a regular one by comparing it with a plurality of mountable component names of the component arrangement data.

According to a second aspect of the present invention, there is provided a component arrangement data forming method for forming component arrangement data by providing a component supply section having a plurality of substitute component type names of components which can be mounted in a proper supply position.

According to a third aspect of the present invention, there is provided a component arrangement data forming method for a component supply section for automatically forming component arrangement data having a plurality of substitute component type names of components which can be mounted in a proper supply position through a detecting process by using a detection section. The detecting section detects type of component set in a supply position, and an editing and registering process writes the detected component type into component arrangement data.

According to a fourth aspect of the present invention, a component mounting apparatus includes a mounting control means for implementing any one of the component supplying method or the data forming methods of the first to third aspects.

According to a fifth aspect of the present invention, there is provided a method as in any one of the first to third aspects. In particular, a replaced position of a replacing component supply unit of the component supply section is stored, and the data of the component supply unit at the replaced position is checked.

According to a sixth aspect of the present invention, there is provided a method as in any one of the first to third aspects. A replaced position of a replacing component supply unit of the component supply section is stored, and the data of the component supply unit at the replaced position and a component supply unit adjacent to the replaced position is checked.

According to the present invention, a highly reliable effective component supplying method (for preventing erroneous setting) for a variety of substitute components of the two-route purchase or the like is obtained.

BRIEF DESCRIPTION OF THE DRAWINGS

These and other aspects and features of the present invention will become clear from the following description taken in conjunction with the preferred embodiments thereof with reference to the accompanying drawings, in which:

FIG. 3 is an explanatory view of component arrangement data of one embodiment of the present invention;

FIGS. 4A and 4B is an explanatory view of component arrangement data of one embodiment of the present invention;

FIG. 10 is an explanatory view of component arrangement data of another embodiment of the present invention;

DETAILED DESCRIPTION OF THE INVENTION

Figure 1:
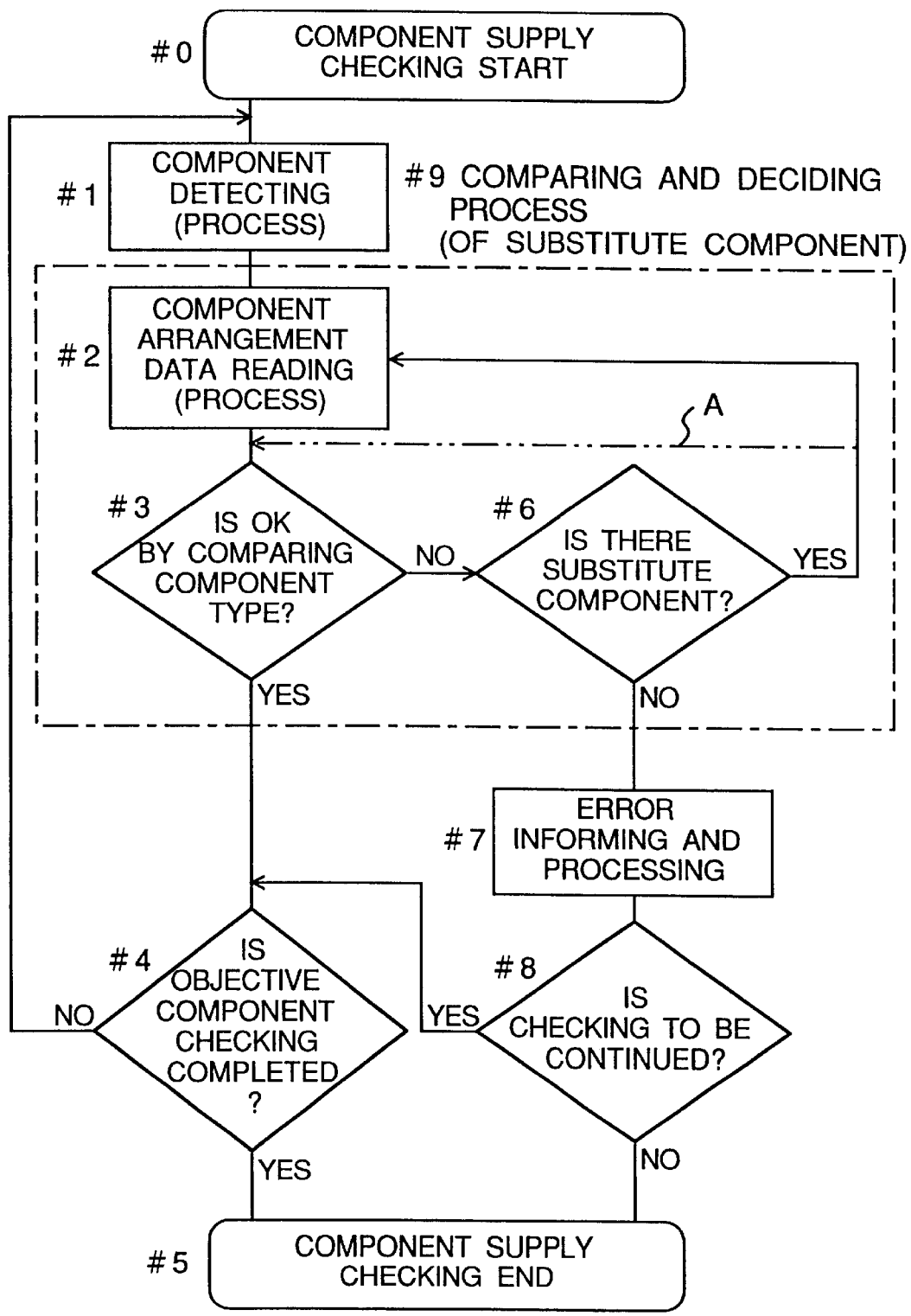
FIG. 1 is a flowchart showing a component supplying method according to one embodiment of the present invention.

Before the description of the present invention proceeds, it is to be noted that like parts are designated by like reference numerals throughout the accompanying drawings.

In the present invention, a component supply section 5 supplies a component to a printed board by a detecting process using component arrangement data 200 having a plurality of substitute component type names of components which can be mounted in a proper supply position 100, and by using a detection section 9 to detect a component type set in the component supply position 100. A comparing and deciding process is used to determine whether the component set in the component supply position 100 is a regular one by comparing it with a plurality of mountable component names of the component arrangement data 200. Therefore, even when the component is similar to a component of another manufacturer or a less expensive component, or when the component type name is different, the substitute component (type name) which can endure the proper use and mounting can be correctly easily determined in a short time. This obviates the need for forming a label of the representative component name, reissuing of the label or forming a comparison list of the substitute components. In addition, it reduces the labor in production and prevents erroneous component mounting in a component setting stage, thereby providing a highly reliable effective component supplying method.

The invention is a component arrangement data forming method for a component supply section, including assembling a plurality of (substitute) component type names of components which can be mounted in the proper supply position. It is only required to form and control a pair of component arrangement data without forming and controlling a number of component arrangement data corresponding to combinations of a variety of substitute components used as arranged in the component supply section, thereby producing an effect of allowing the component arrangement data to be easily formed in a short time.

The invention is a component arrangement data forming method for a component supply section for automatically forming component arrangement data having a plurality of substitute component type names of components which can be mounted in the proper supply position through a detecting process by a detection section for detecting the type of component set in a supply position. An editing and registering process writes the detected component type into component arrangement data This produces an effect of executing mounting while correctly and more easily forming a number of component type names and achieving the formation of highly reliable component arrangement data which serves as a reference for the component supplying and mounting method.

An electronic component mounting apparatus is mounted with a mounting control means for implementing any one of the component supplying method or the data forming methods. With the function of any one or a combination of these methods, it has an effect of effectively producing appropriate electronic component mounting having a higher reliability in the component mounting process using a plurality of substitute components.

Embodiments of the present invention will be described below with reference to FIG. 1 through FIG. 7.

(First Embodiment)

Figure 2:
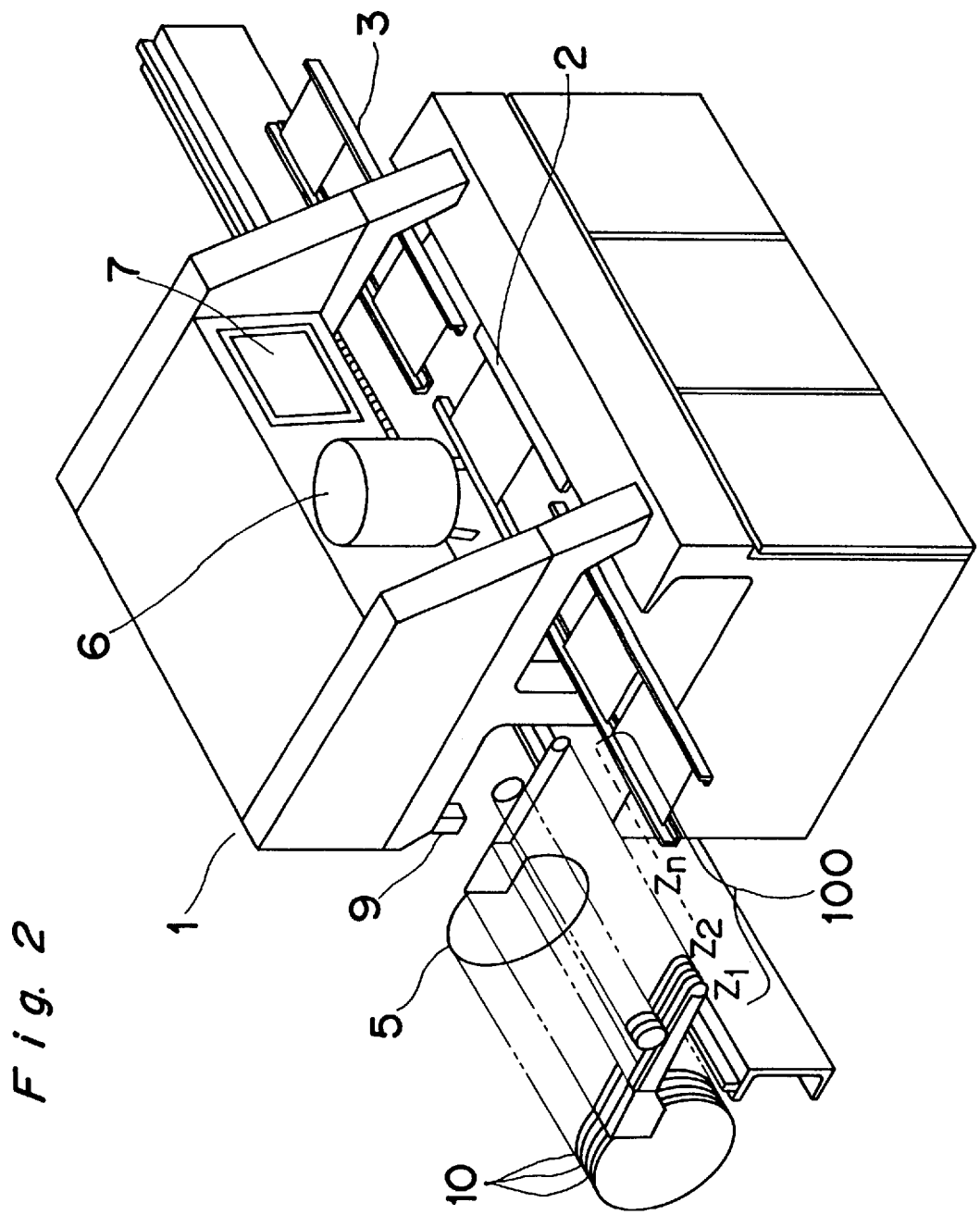
FIG. 2 is a perspective view of a component mounting apparatus.

FIG. 1 is a flowchart of a component supplying method according to a first embodiment of the present invention, while FIG. 2 is a perspective view of a component mounting apparatus. In this apparatus 1, a plurality of parts cassettes 10 for storing components 13 to be mounted on printed boards are removably attached to the component mounting apparatus so that the parts cassettes can reciprocally move along the longitudinal direction of the apparatus and position one of the parts cassettes which stores required components at a component supply section 5 of the apparatus. The parts cassette 10 has a taped component with each of the components accommodated into one of the recesses of an elongated member and covered with a cover tape or shutters. One of the components is sequentially positioned at a component supply position (i.e., the component supply section) of the parts cassette 10 while the cover tape is removed from the elongated member. The board is transferred to and positioned at a mounting position in the apparatus 1, and after component mounting, the board is transferred from the mounting position to the outside of the apparatus 1 by a board transfer device. After the parts cassette which stores required components is positioned at a component supply position, a component mounting head (suction head) of the apparatus moves to the component supply section and sucks one of the components in the positioned parts cassette, and then moves to a board onto which the sucked component is mounted while passing over a detection section. When the sucked component is passed over the detection section, the configuration of the component is detected by a detector to determine whether or not the sucked component is a required one. If not, the sucked component is not mounted on the board and is discharged to a discharge section. If yes, the sucked component is mounted on the board.

In the mounting apparatus 1, when there is a change of the type of printed board to be produced or depletion of components as a consequence of the consumption of components 13 on the component supply section 5, the parts cassette 10 including the objective component 13 is replaced for replenishment. Upon depressing a production start or component replenishment completion switch at an operation section 7, a component supply check start is started in a process #0 (step "0") shown in FIG. 1. For example, a substitute component P1$b$ is set in a component supply unit Z1, the component type name P1$b$ of the parts cassette 10 in the component supply position Z1 may be detected by a detection section 9 through a component detecting process #1. That is, information stored in an IC memory or IC chip provided on the parts cassette is read at the component supply position Z1 by the detection section 9 to obtain data of component type name, manufacture name, number of components (present storing number), etc. Before the mounting operation is started, information which all of the parts cassettes 10 has is read in a storage section 26 to form a component library. The data in the component library is used in the processes described below.

In a comparing and deciding process #9, P1$m$ 203 in the case of position Z1 is read in this case among component type names 202 corresponding to the position from component arrangement data 200 having a plurality of substitute component type names 204 of the components which can be mounted in a component arrangement position of the number 201 shown in FIG. 3 through a component arrangement data reading (process) #2. The component name is then subjected to a component type comparing step in a process #3. When it is not compatible (No), the presence or absence of a substitute component 204 is decided in a process #6. When there is a substitute (Yes), substitute component type names P1$a$ and P1$b$ are successively read again and repetitively subjected to the comparing and deciding process in the processes #2 and #3. When the substitute component P1$b$ is OK, it is decided whether or not there is a further check of the next objective supply position component in a process #4. The program flow proceeds to the component deciding process #1 in the case of end (No), or the component supply check ends in the case of end (Yes). Alternatively, after the process #6 is performed, the process #2 may be performed as shown by a two-dot chain line A in FIG. 1.

When P2$m$ is erroneously set in the component supply position Z1, the component is not a substitute component in the same processes #2, #3 and #6. Therefore, the history of an operator call implemented by the lighting of a patrol light, display on a CRT of the operation section 7 and transmission of an error message by a communication device as well as the results (date and time, supply position, component type name, etc.) of the component supply check are saved (for example, recorded in an information section 210 or the like) in an error informing process #7 and stored in the storage section 26 so that the error can be subsequently tracked and analyzed from the operation section 7. In a process #8, a selection is allowed to select between the continuation of the checking and end for the present is made, thereby enabling a restoration to be achieved every time an error occurs or the checking of the other objective components Z3, Zn, . . . continued from the process #4.

When a fresh component P2$x$ is set in Z2 and the component checking start #0 is executed, the component is subjected to the same processes from the process #2 to be compared with P2$m$ corresponding to Z2 among the component type names 202 and 203 at the process #3. Consequently, the answer No results, and since the substitute component type 204 does not exist for a process #6, error information is issued in the process #7. When the component P2x can be used as a new substitute component of P2m, it is designated from the operation section 7 and additionally registered as a substitute component type name 204 of Z2 of the component arrangement data 200. Subsequently, P2x is checked again as a substitute component of P2m and is approved in the process #3 through the processes #8→#4→#1, . . .

As another component arrangement data forming method, forming and editing such as replacing a master component 203 with a substitute component 204 in the component type names 202 of Zn of an arbitrary component arrangement position number 201, changing, deleting, adding, inserting and copying can be freely executed. Therefore, in the comparing and determining process 9, effective component checking of less waste can be executed by changing the priority in comparing the component type in the component arrangement reading process #2 and the component type comparing process #3.

It is to be noted that Z0, P0, Pa and Pb of the component arrangement data 200 are parameters 205 (referred to as a component supply parameter hereinafter) for setting the control conditions of the component supply section. There can be executed in the comparing and deciding process #9 an operation of collectively making a substitute (OR) A invalid when Pa=0 (where 0 means that a substitute component has not been detected), making the substitute (OR) A valid when Pa=1 (where 1 means that a substitute component has been detected) and handling component type names P1a, P3a, Pna, . . . designated as the substitute (OR) A as master components when Pa=100 or a similar operation.

(Second Embodiment)

FIG. 4 explains embodiments of second and third forming methods of the component arrangement data 200.

FIG. 4A is comprised of component arrangement data group 200a and 220, wherein the component arrangement data 200 explained in the first embodiment has a linkage of the component type (master) 203 and substitute components 204A, B, . . . are separated. In a case where the component arrangement position is Zn, then Pnm of 200 can be linked as a master component type name with Pnm, Pna, Pnb, . . . of group 220. As described above, the component arrangement data group are only required to be linked with one another by some data even when they are separated into a plurality of, or not fewer than two, types. For example, if group 220 is made to have component arrangement position numbers Z1, Z2, . . . and the substitute component type 204 is used as a linkage with it, the same effect can be produced. The other information 210 may be an integrated body of independent data.

FIG. 4B shows a component arrangement data group 200b having a construction in which the component arrangement data 200 is incorporated into a known NC program 230 as command data for operating the mounting apparatus 1. The mounting apparatus 1 takes a component from Zn of the component arrangement position number 201 by a mounting number K and checks in the detection section the fact that the component of Zn is either the master Znm or the substitute component Pna, Pnb, . . . of the component type name at coordinates Xk, Yk of the printed board under the conditions of a control command SK (e.g., mounting speed and rotating direction of component). When the components coincide, the mounting can be executed. The above is an example of the forming method of the component arrangement data 200b. It is also acceptable to read the recognition data of the component corresponding to the component type names 203 and 204 from the other information section 210 in the mounting stage and execute the correct recognition correction by the regular recognition data corresponding to the component, thereby preventing the mounting apparatus from stopping for a recognition error due to a substitute component.

As described above, a plurality of component type names of components which can be mounted in the proper supply position can be linked and associated with one another. By the forming method as shown in the component arrangement data groups 200, 200a and 200b, there can be formed component arrangement data having one or a plurality of substitute component type names. Although the various data groups shown in FIG. 3 and FIG. 4 have been described on the basis of data in a table form, the data may have any of the forms of numbers, letters, symbols, figures, images and the like which are in a database or linked via a network.

Figure 5:
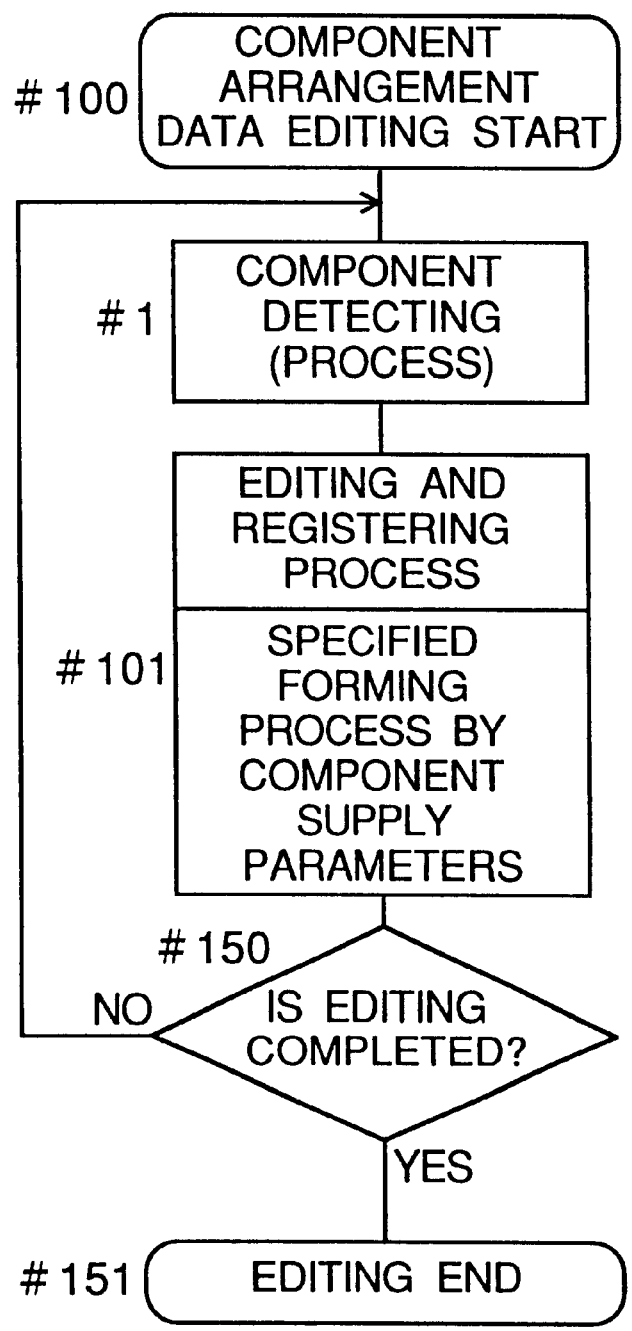
FIG. 5 is a flowchart of a component arrangement data automatic forming method.

It is also acceptable to automatically input, add, register, edit or perform similar works on the master 203 and the substitute components 204 of the component type name 202 of Z1, Z2, . . . into the component arrangement data groups 200, 200a and 200b by the component supply parameters 205 in an editing and registering process #101 by setting a number of components in arbitrary component supply positions. The type name of the component set in the component detecting process #91 can then be read, and the processes can be performed several times according to a procedure as shown in FIG. 5 at the processes #150 and #151.

When a plurality of component supply sections 5 exist and the component supply sections 5 are individually driven or in a similar case, there are arranged similar components 13 in parts cassettes 10 for each of them. It is acceptable to execute component supply control by forming component arrangement data 200 of any of the component supply sections 5 and copying the data a plurality of times for the other component supply sections 5, so as to use the component arrangement data 200 as those of the whole component supply section.

(Third Embodiment)

Figure 6:
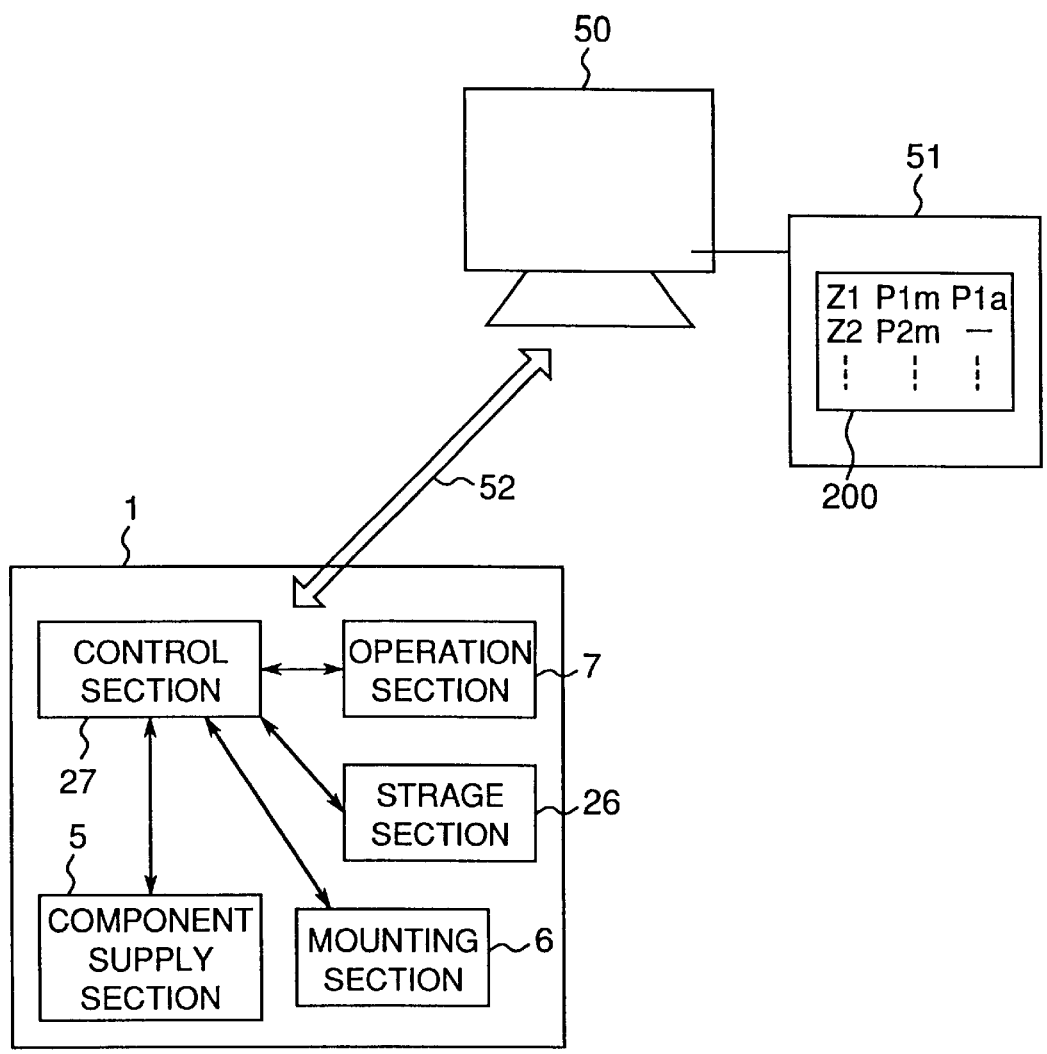
FIG. 6 is an explanatory view of a system construction according to a component arrangement data forming method.

FIG. 6 is an example of a case in which the aforementioned component arrangement data groups 200, 200a and 200b are formed by a data forming device 50 such as an external personal computer or the like.

The component arrangement data group 200 that has been formed and stored in the storage section 51 is inputted to a control section 27 or a storage section 26 of the mounting apparatus 1 by an input and output means 52 implemented by communication or medium such as a floppy disk. The control section 27 executes component supply and checking according to the flowchart of FIG. 1 similar to the aforementioned manner based on the component arrangement data 200 taken in.

Here, in order to accomplish the above-described operations, the specified construction of the apparatus in the first and second embodiments is described with reference to FIG. 9.

Figure 9:
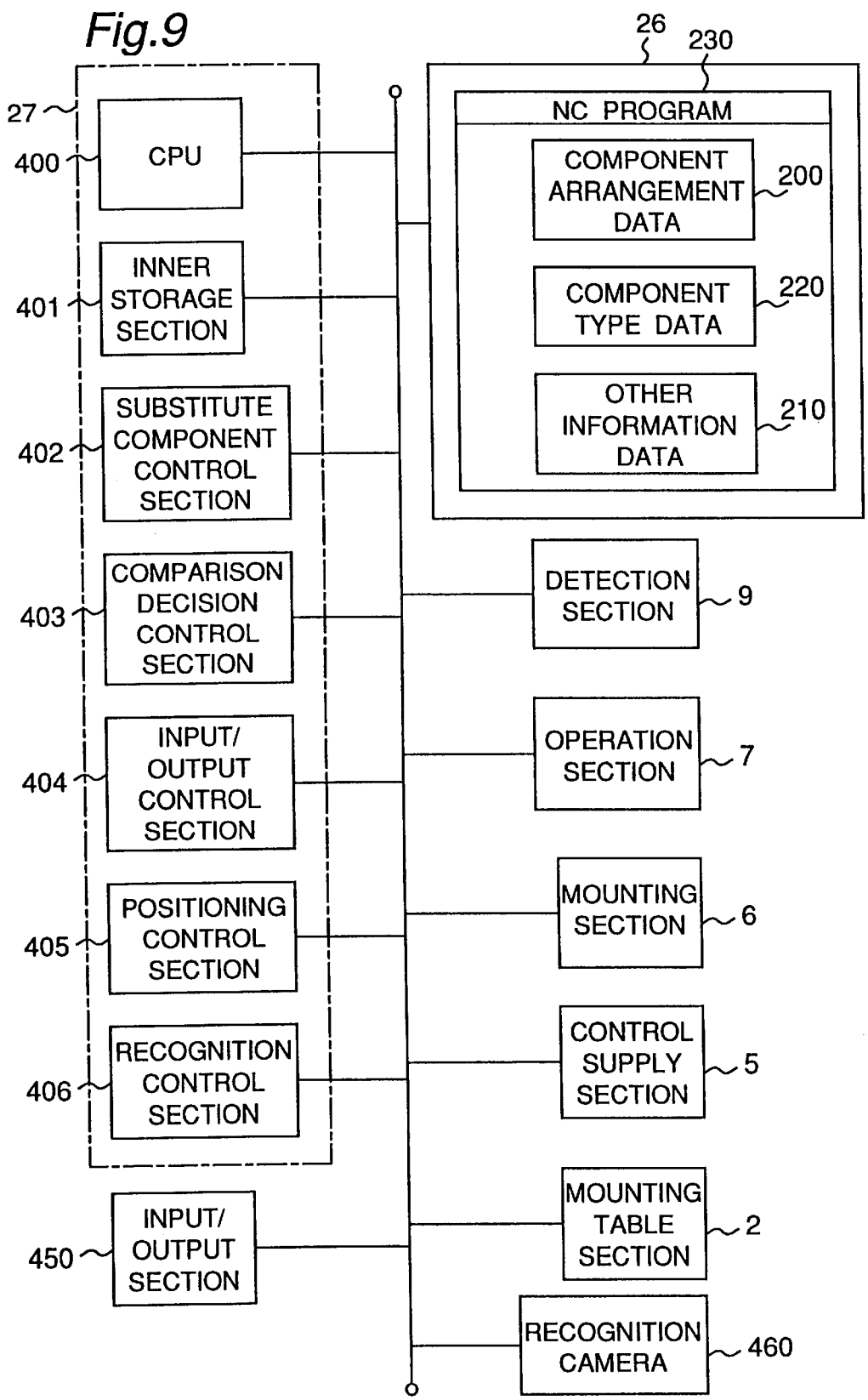
FIG. 9 is a block diagram showing the control section of the embodiment.

In FIG. 9, the control section 27 performs the control of the whole apparatus. The control section 27 includes a CPU 400, an inner storage section 401, a substitute component control section 402, a comparison decision control section 403, an input/output control section 404, a positioning control section 405, and a recognition control section 406. The inner storage section 401 temporarily stores data of the storage section 26 and data obtained after calculation and comparison determination. The substitute component control section 402 controls the process #6. The comparison decision control section 403 controls the process #3. The input/output control section 404 controls data communication between the inside and outside of the apparatus and input and output by means of an FD or the storage section, through an input/output section 450. The positioning control section 405 controls the positioning of the suction head for sucking the component to be mounted on the board in X and Y directions perpendicularly to each other on the surface of the board and the rotation angle around the Z direction perpendicular to the X and Y directions, the drive of the head, and the table transfer drive of a table where the board is positioned. The recognition control section 406 controls the recognition of the board and component by using a recognition camera 460 for recognizing the component. The detection section 9 detects the information of the component supply section 5 by reading information stored into IC codes or bar codes provided on the parts cassettes 10 as one example.

On the other hand, the storage section 26 has an NC program for performing the component mounting etc., and includes component arrangement data group 200, component type data group 220, and other information data group 210. The component supply section 5 has the parts cassettes or trays where the components are stored. The mounting section 2 includes an XY table for positioning to-be-mounted positions of the board to the specified mounting positions. The storage section 26 may be arranged inside of the control section 27.

According to the above construction, in addition to the above operations, the following operations may be performed.

FIG. 10 shows a table similar to FIG. 3 except for the component type names P2*a* and P2*b* of substitutes (OR) A and B at the component arrangement position number Z2. As one example, there can be executed in the comparing and deciding process #9 an operation of collectively making a master 203 and a substitute (OR) B invalid when P0=0 and Pb=0, making only the substitute (OR) A valid when Pa=1. This means that the master components are replaced with the substitute components A. Such an operation can be applied to cases where component mounting is performed in accordance with European safety standards; ranks of products such as high quality products or normal products; use conditions or production conditions such as temperature characteristics, recycle use, and durability; and client's needs such as change of product types or components. According to this operation, without any change of the NC program, the apparatus can cope with a variety of specifications simply by designating the substitute components.

Figure 11:
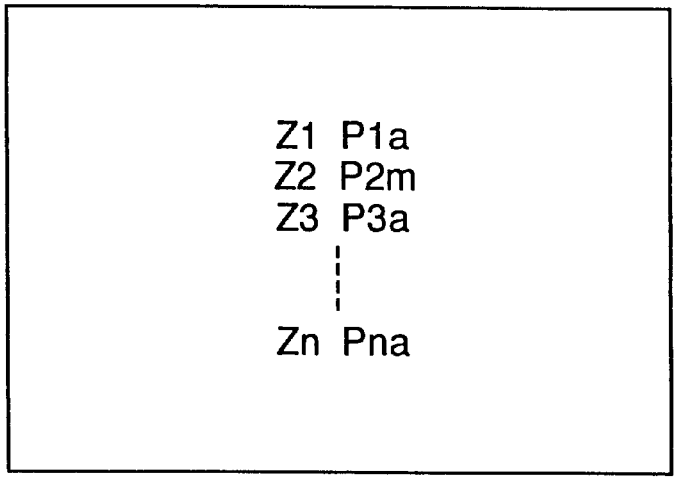
FIGS. 11 and 12 are diagrams of output results after partial data in the component arrangement data of FIG. 3 is replaced with some data.
Figure 12:
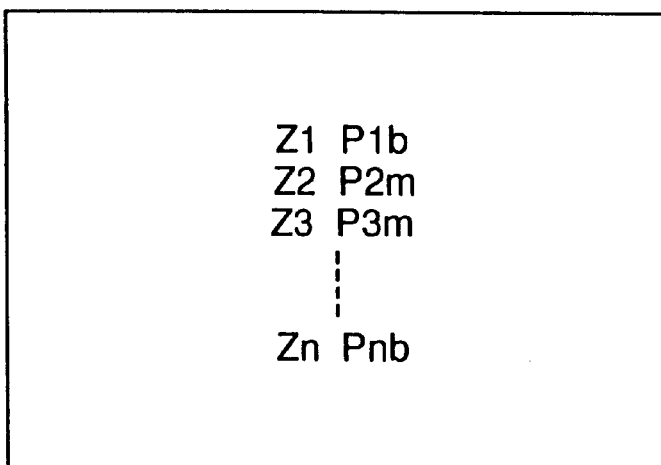

As another example, when only a few or several items in the data change due to the component replacement or operator's or program instructions, only changed data is stored in the storage section 26 without storing the whole amount of data. For example, when only five data items are changed among the 100 data items, five changed data item are produced and stored in the storage section 26 without storing the non-changed data. It is preferably not to change common data before and after the change of data. As an example, when the storage section 26 initially has data shown in FIG. 3 and the master components P0, P3*m*, . . . Pnm are replaced with the substitute components P1*a*, P3*a*, . . . Pna by designating a component replacement relationship of P0=P1*a* and P3*m*=P3*a* etc., only the output result shown in FIG. 11 is stored in the storage section 26. As another example, when the storage section 26 initially has data shown in FIG. 3 and the master components P0, . . . Pnm are replaced with the substitute components P1*b*, . . . Pna by designating component replacement relationship of P0=P1*b*, only the output result shown in FIG. 12 is stored in the storage section 26.

Figure 13:
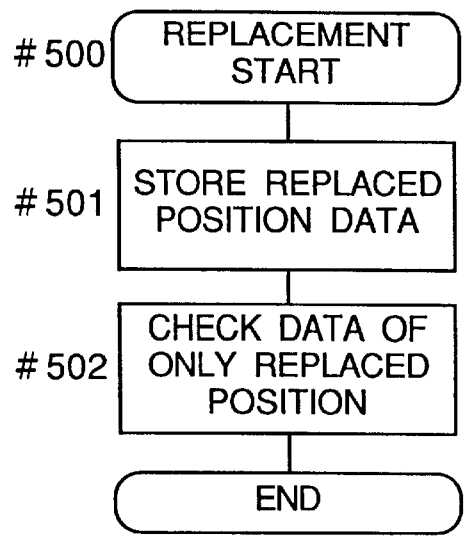
FIG. 13 is a flowchart showing replacement of the parts cassette in the embodiment.
Figure 14:
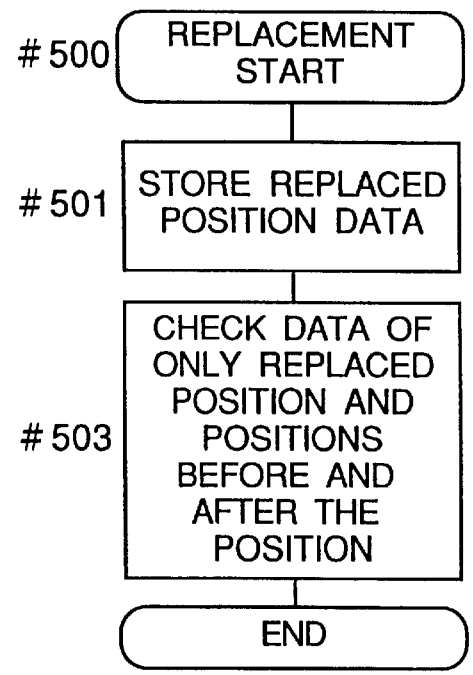
FIG. 14 is a flowchart showing replacement of the parts cassette in the embodiment.

Furthermore, as shown in FIG. 13, when one of the parts cassettes 10 is replaced with a new one at the replacement start process #500, the position data of the replaced parts cassette 10 is previously stored in the storage section 26 etc. at the process #501, through input of the operator or the detection at the component supply section 5. Then, the replaced component data is checked at the process #502 to determine how the data is changed. As another example, as shown in FIG. 14, after the process #501, the component data in the replaced parts cassette 10 and the component data in the parts cassettes 10 before and after the replaced position (adjacent to the replaced position on both sides) the replaced position are checked at the process #503 to determine how the data is changed, so as to remove erroneous detection of the replaced data due to mis-detection of the replaced position of the parts cassette 10.

Figure 7:
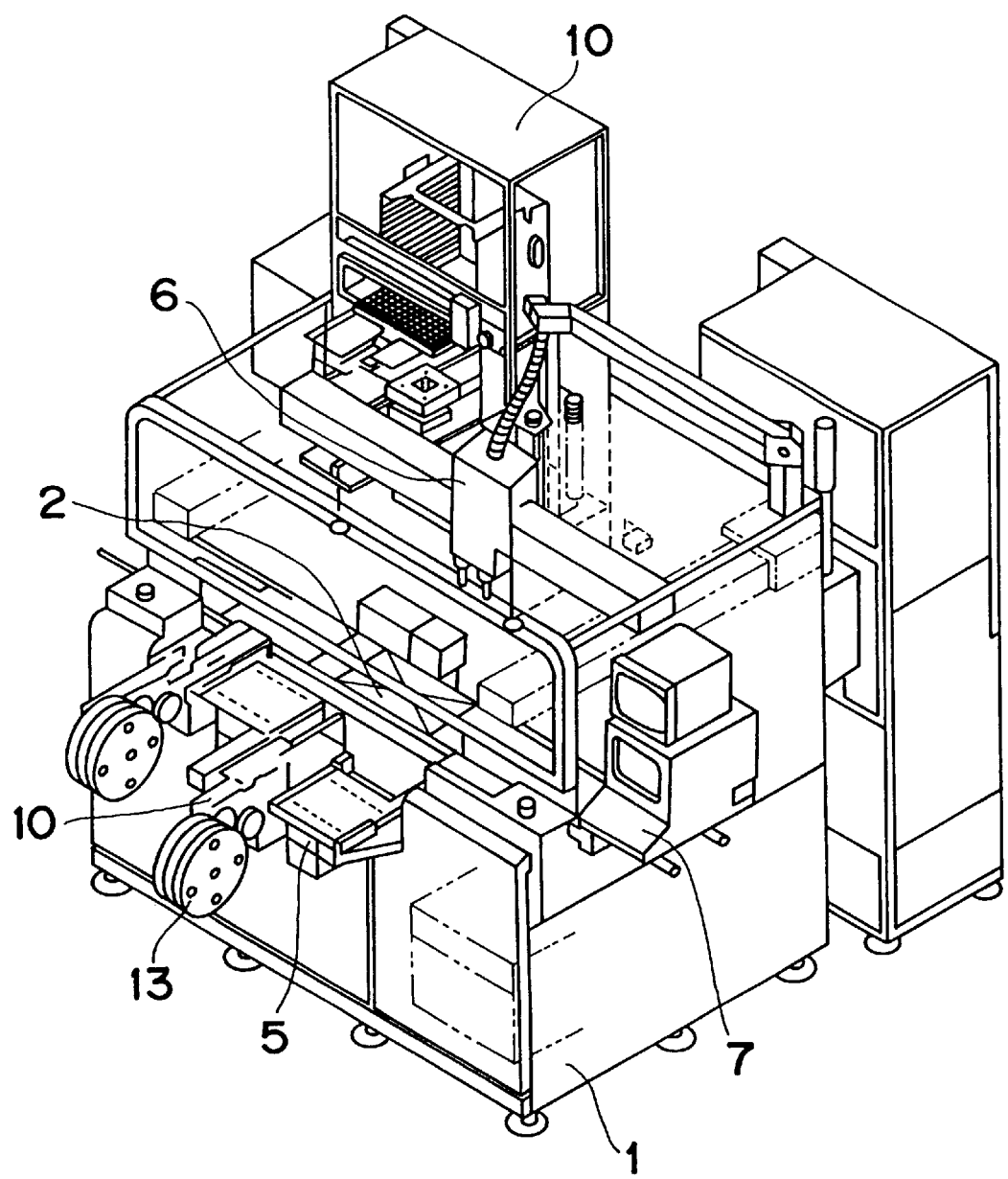
FIG. 7 is a perspective view of a component mounting apparatus.
Figure 8:
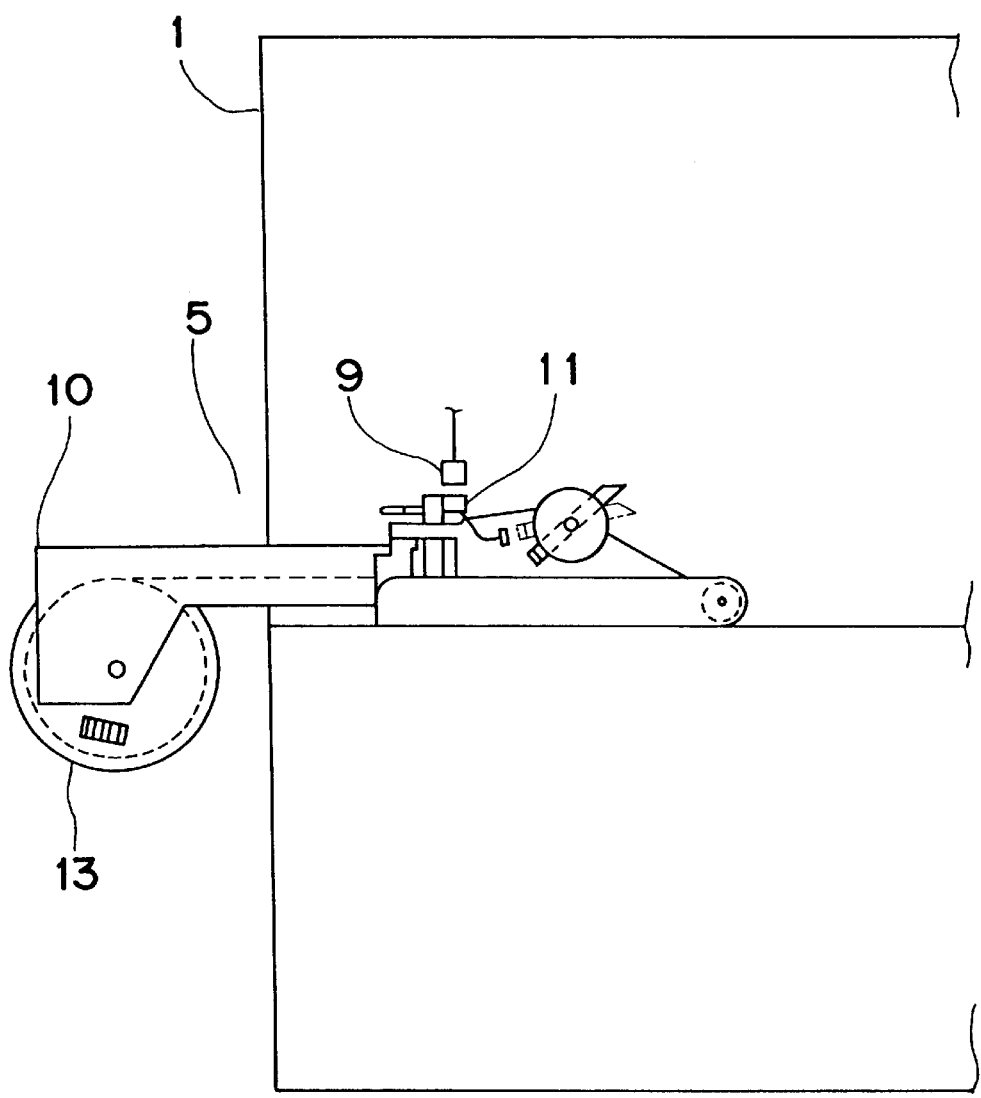
FIG. 8 is a side view of a prior art component supply section.

Although the mounting apparatuses of the aforementioned first, second and third embodiments have a parts cassette of the sliding component supply unit 10 at the component supply section 5 and the fixed detection section 9 according to the aforementioned description, they may have a component supply unit 10 as shown in FIG. 7 including a component supply section 5 having a tray, a bulk cassette and so on, a mounting section 6 for performing positioning and a detection section mounted on the mounting section 6. The detection section may be any means such as a camera, an optical system, an electromagnetic system, a laser or one using the storage device of the mounting section 2 so long as it can decide the type of a variety of components, producing the same effect.

Although the storage section 11 of the component type names of the components 13 in a variety of shipped forms detected by the detection section 9 has been described as one mounted on the parts cassette as the component supply unit 10 according to the description, it may be an identification code owned by each component 13 (a variety of integrated bodies of reel, bulk, tray or the like) or an identification code such as a two-dimensional bar code attached to each component so long as it can discriminate the component type.

The component supplying method and the data forming method of the present invention can be applied not only to electronic components but also to semiconductors, connectors, compact mechanical assembly components and so on with a similar construction, appropriately producing similar functions and effects.

As described above, according to the present invention, the less expensive components of two-route purchase can be used as the component to be set in the proper supply position of the component supply section, and erroneous setting is further eliminated by automatically speedily checking the substitute component, thereby allowing a highly reliable component supplying method and mounting method to be provided.

Furthermore, it reduces the burdens of the operators in forming the data, changing the plan, replenishing and replacing components when the components are depleted and in other operations, achieves personal saving and reduces a loss due to the stop of the equipment attributed to a mistake, error or the like, serving as an appropriate means for improving the productivity.

The entire disclosure of Japanese Patent Application No. 9-5219 filed on Jan. 16, 1997, including specification, claims, drawings, and summary are incorporated herein by reference in its entirety.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A component supply method to be performed in a component supply section for supplying components to a component mounting section, the method comprising:
    detecting a component type of a component positioned in a component supply position at the component supply section, said detecting being performed by a detecting section; and
    determining whether the component type of the component positioned in the component supply section detected by the detecting section is an acceptable type by comparing the component type to a plurality of component types in a component arrangement data group, the plurality of component types in the component arrangement data group including master component types and substitute component types acceptable to be mounted in respective component supply positions.

2. The component supply method of claim 1, wherein said determining whether the component type is an acceptable type further includes:
    comparing a detected component type to a master component type of the component arrangement data group to determine if the detected component type coincides with the master component type, the master component type corresponding to the respective component supply position of the detected component; and
    if the detected component type does not coincide with the master component type, comparing the detected component type to at least one substitute component type of the component arrangement data group to determine if the detected component type coincides with the at least one substitute component type, the at least one substitute component type corresponding to the respective component supply position of the detected component.

3. The component supply method of claim 1, wherein said detecting comprises detecting a component name of the component type, the plurality of component types in the component arrangement data group comprising a plurality of component names including master component names and substitute component names acceptable to be mounted in respective component supply positions.

4. The component supply method of claim 3, wherein said determining whether the component type is an acceptable type further includes:
    comparing a detected component name to the master component names of the component arrangement data group to determine if the detected component name coincides with one of the master component names; and
    if the detected component name does not coincide with one of the master component names, comparing the detected component name to the substitute component names of the component arrangement data group.

5. A component mounting apparatus comprising:
    a mounting control unit operable to control a component mounting process comprising:
    a component type for detecting a component positioned in a component supply position at the component supply section, said detecting being performed by a detecting section; and
    the component type for determining whether the component positioned in the component supply section detected by the detecting section is an acceptable type by comparing the component type to a plurality of component types in a component arrangement data group, the plurality of component types in the component arrangement data group including master component types and substitute component types acceptable to be mounted in respective component supply positions.

6. The component supply method of claim 1, further comprising:
    storing a replaced position of a replacing component supply unit of the component supply section; and
    checking data of the component supply unit at the replaced position.

7. The component supply method of claim 6, wherein said checking of the data comprises checking data of the component supply unit at the replaced position and checking data of a component supply unit adjacent to the replaced position.

8. A component arrangement data forming method, the component arrangement data to be used by a component supply section for supplying components to a component mounting section for mounting the components on a printed board, the method comprising:
    assembling master component type data corresponding to types of master components to be mounted in a component supply position; and
    assembling substitute component type data corresponding to acceptable substitute components for the master components to be mounted in the component supply position.

9. A component mounting apparatus comprising:
    a mounting control unit operable to control a component mounting process comprising:
    a master component type for assembling data corresponding to types of master components to be mounted in a component supply position; and
    a substitute component type for assembling data corresponding to acceptable substitute components for the master components to be mounted in the component supply position.

10. The component arrangement data forming method of claim 8, further comprising:
    storing a replaced position of a replacing component supply unit of the component supply section; and
    checking data of the component supply unit at the replaced position.

11. The component arrangement data forming method of claim 10, wherein said checking of the data comprises checking data of the component supply unit at the replaced position and checking data of a component supply unit adjacent to the replaced position.

12. A component arrangement data forming method, the component arrangement data to be used by a component supply section for supplying components to a component mounting section for mounting the components on a printed board, the method comprising:
    assembling a component arrangement data group including a group of substitute component types corresponding to acceptable substitute components for master components to be mounted in the component supply position, said assembling being performed automatically by detecting a component type of a component positioned in a component supply position; and editing the component arrangement data group by writing a detected component type into the component arrangement data group.

13. The component arrangement data forming method of claim 12, wherein said detecting comprises detecting a component name of the component type, the plurality of substitute component types in the component arrangement data group comprising a plurality of substitute component names acceptable to be mounted in respective component supply positions.

14. A component mounting apparatus comprising:
a mounting control unit operable to control a component mounting process comprising:
a component arrangement for assembling data group including a group of substitute component types corresponding to acceptable substitute components for master components to be mounted in the component supply position, said assembling being performed automatically by detecting a component type of a component positioned in a component supply position; and
the component arrangement for editing data group by writing a detected component type into the component arrangement data group.

15. The component arrangement data forming method of claim 12, further comprising:
storing a replaced position of a replacing component supply unit of the component supply section; and
checking data of the component supply unit at the replaced position.

16. The component arrangement data forming method of claim 15, wherein said checking of the data comprises checking data of the component supply unit at the replaced position and checking data of a component supply unit adjacent to the replaced position.

* * * * *

UNITED STATES PATENT AND TRADEMARK OFFICE
CERTIFICATE OF CORRECTION

PATENT NO. : 6,480,751 B1
DATED : November 12, 2002
INVENTOR(S) : Takeshi Kuribayashi et al.

It is certified that error appears in the above-identified patent and that said Letters Patent is hereby corrected as shown below:

<u>Title page,</u>
Item [75], the third inventor's address should be -- Nirasaki --, not "Niesaki".
Item [86], the date of §371 (c)(1), (2), (4) should be -- July 15, 1999 --, not "August 15, 1999".
Item [57], ABSTRACT,
Line 1, before "High-speed" insert -- A --; replace "high reliability" with -- High reliable --.
Line 3, after "mounted" insert -- . -- (period).
Line 4, replace "through" with -- This check is performed by --; after "process" insert -- (#1) --; replace "by means of" with -- using --.
Line 5, after "data" insert -- (200) --.
Line 6, after "names" insert -- (202) --.
Line 7, after "position" insert -- (100) --.
Line 8, after "section" insert -- (5) --; after "and" (first occurrence) insert -- by using --; after "section" insert -- (9) --; replace "decid-" with -- determining --.
Line 9, delete "ing" after "process" insert -- (#9) --.

Signed and Sealed this

Seventeenth Day of June, 2003

JAMES E. ROGAN
*Director of the United States Patent and Trademark Office*